Figure 1:
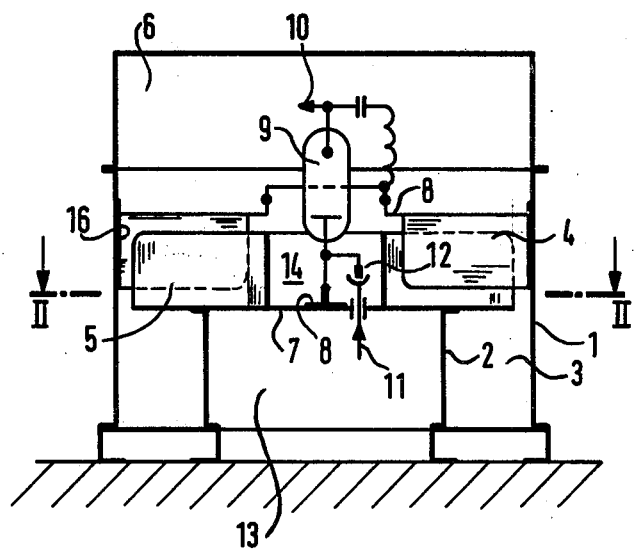

United States Patent [19]

Lamberts et al.

[11] 4,211,984

[45] Jul. 8, 1980

[54] OSCILLATING CIRCUIT ARRANGEMENTS FOR HIGH FREQUENCY INDUSTRIAL GENERATORS

[75] Inventors: Kurt Lamberts; Jürgen Leppin, both of Clausthal-Zellerfeld; Berndt Greten; Harry Neubauer, both of Springe, all of Fed. Rep. of Germany

[73] Assignee: Bison-Werke, Bahre & Greten GmbH & Co. KG, Springe, Fed. Rep. of Germany

[21] Appl. No.: 905,081

[22] Filed: May 11, 1978

[30] Foreign Application Priority Data

May 17, 1977 [DE] Fed. Rep. of Germany ....... 2722355

[51] Int. Cl.$^2$ ............................................... H03B 5/18
[52] U.S. Cl. .............................. 331/97; 219/10.55 R; 331/101
[58] Field of Search ................. 331/96, 97, 98, 101, 331/167–171; 219/10.55 R, 10.75

[56] References Cited

U.S. PATENT DOCUMENTS

| 3,147,360 | 9/1964 | Tibbs et al. | 331/97 X |
| 3,169,230 | 2/1965 | Tibbs | 331/9 |

FOREIGN PATENT DOCUMENTS

| 952186 | 11/1956 | Fed. Rep. of Germany | 331/101 |
| 1075211 | 2/1960 | Fed. Rep. of Germany | 331/101 |

OTHER PUBLICATIONS

Kuk et al., "Peredajuschtschije ustrojstwa mnogokanalnynch radiorelejnych sistem swjasi", Swajaz, U.S.S.R., 1968, pp. 255–260.

Schachgiljdjan, "Projektirowanije radio peredajuschtschich ustrojstw", Swajaz, U.S.S.R., 1976, pp. 251, 262, 280.

Terman, "Radio Engineer's Handbook, McGraw Hill, New York, 1943, p. 273.

*Primary Examiner*—Siegfried H. Grimm
*Attorney, Agent, or Firm*—Townsend and Townsend

[57] ABSTRACT

A high frequency industrial generator, especially suitable for supplying power to a device for heating an electric poorly conducting substance such as a fleece of a cellulose material, comprises two hollow concentrically disposed conductors each of square section and supporting respective electrode plates of an associated capacitor. All the plates are vertically disposed and lie at right angles to the walls of the respective conductors. In the middle of the electric plates there is situated a triode electron tube electrically connected to the plates to form an oscillating circuit. The anode potential and cooling water supply for the electron tube is located within a field free space inside the internal conductor. One set of electrode plates can be adjusted relative to the other to adjust the frequency and the arrangement ensures only low electrical losses are incurred.

11 Claims, 2 Drawing Figures

OSCILLATING CIRCUIT ARRANGEMENTS FOR HIGH FREQUENCY INDUSTRIAL GENERATORS

This invention relates to an oscillating circuit arrangement for high frequency industrial generators and has particular reference to a generator the output of which is suitable for subsequent use for the heating of relatively poorly electrically conducting substances preferably in the form of a fleece made of layers, tracks, balls or the like of a material containing ligno cellulose and/or cellulose and/or other substances; the generator having an electron tube associated with a resonant circuit and taking the form of a coaxial conduction system integrated with the interdigitated plates of a capacitor which form the entire capacity of the system.

In high frequency electrical generators of this type exacting requirements are set in respect of power and frequency stability which up to now could only have been met through measures involving high constructional and manufacturing costs.

An oscillating circuit for high frequency industrial generators is known from DE-AS 1,075,211 which has the form of a box closed on all sides and of rectangular cross-section and which has inside the box a free standing surface-like internal conducting member which forms a part of the inductance of the oscillating circuit and whose one edge is connected with a wall of the box and whose opposite edge carries a transverse plate, which together with the wall of the box opposite to the plate, forms the capacitor of the oscillating circuit. In this known oscillating circuit measures are taken to so couple and decouple the high frequency energy to both sides of the internal conducting member that the harmonic radiation is kept as small as possible. The principal disadvantage of the known oscillating circuit is above all that it has a relatively large inductance, because the surface around which the magnetic field circulates has a relatively large cross section, and relatively large conducting paths exist to the plates of the capacitor which lie opposite to the wall of the box, because the surfaces of the plates of the capacitor are at right angles to the lines of current in the surface-like internal conducting member. With such an arrangement associated relatively large losses must be catered for.

A high frequency oscillating circuit in the form of a tank circuit is known from DE-PS 952,186 which is constructed in similar manner to the oscillating circuit of DE-AS 1,075,211 and in which measures are taken in order to reduce an undesired change of frequency due to unequal heating. This is achieved by flexibly connecting together, or to the capacitor, at at least one position, the surfaces which in general form the self induction of the circuit. The disadvantages described in connection with DE-AS 1,075,211 are however also present in this known construction of the oscillating circuit.

An apparatus for dielectrically heating by a separately excited generator is known from US-PS 3,169,230 in which measures are taken to automatically tune the load circuit to the fixed oscillator frequency these measures comprise the cyclic changing of the resonant circuit in the power amplifier to achieve a tuning of the load circuit to the fixed frequency of the oscillator. The tank circuit used in this circuit arrangement comprises a hollow resonator with a cylindrical outer housing closed at both ends in which is provided a capacitor arrangement comprising three concentric cylinders which are alternatingly connected with the end plates of the tank circuit. This tank circuit arrangement, which is not simple to manufacture, has the disadvantage of a relatively large self inductance of the capacitor as a consequence of the arrangement of the surfaces of the capacitor parallel to the respective neighbouring external conducting surfaces which corresponds with an electrically unfavourable series connection of conducting parts.

The object of the invention is to provide an oscillating circuit arrangement for relatively powerful high frequency industrial generators which in spite of relatively low manufacturing cost is characterized by a high mechanical and electrical stability and specially high operational reliability.

This problem is solved by the invention in that the coaxial conducting system is of square cross sectional form and that the plates of the capacitor are respectively arranged at right angles to the associated surfaces of the internal and external conducting members of the coaxial conducting system.

By the choice of a square cross-sectional form of the coaxial conducting system a resonant circuit of especially high reactive power is obtained with an optimal utilization of the entire volume which is available for the generator, this is of decisive significance for the required operation of the generator at a stable frequency. The chosen arrangement of the plates of the capacitor results in a capacitor for the oscillating circuit of higher capacity and with extremely low self inductance and low losses. This low self inductance of the capacitor comes about because the individual part capacitors can be considered as parallel connected conducting pieces arranged closely one by the side of the other. The inductive portion of the resonant circuit is formed by the inherent self-inductance of the capacitor plates and it is, therefore, not identifiable as a separate component.

In contrast with the conventional use of horizontally disposed plates in the capacitor the construction of the oscillating circuit of the present invention has the additional advantages that, any foreign particles finding their way into the apparatus, which in the prior art capacitors could be expected to give rise to electrical break down, will fall down between the plates into a region of lower electrical field strength and can be relatively easily removed. Furthermore the cooling necessary in consideration of the high powers is made easier because the plates for the cooling medium used which is typically air, stand vertically and offer only a small resistance to flow.

Preferably the electron tube is arranged centrally with respect to the coaxial conducting system and lies at least partially in a rectangular space surrounded by the plates of the capacitor.

The central arrangement of the electron tube in the oscillating circuit means the connection of the electron tube electrodes with the oscillating circuit can be made exceptionally short so that the danger of the formation of parasitic resonances is significantly diminished and the operational reliability of the generator is thus increased.

Preferably the simultaneous supply of DC current energy and cooling water to the anode is made possible by leading them through the field free internal space of the interior conductor and in this manner decoupled from parts conducting high frequencies. The necessity of supplying the circuit via chokes and the associated increased danger of the formation of parasitic oscillations is thus obviated.

In accordance with an advantageous form of the invention one of the electrodes of the capacitor formed of plates vertically upstanding is fixed to and electrically connected with the internal conductor whilst the other electrode of the capacitor which is electrically connected with the external conductor is axially displaceable and can be subsequently fixed in position. This constructional form makes a possible a simple and accurate adjustment of the resonant frequency of the oscillating circuit by changing the position of the movable electrode of the capacitor.

A further advantageous form of the invention comprises the connection of the centrally arranged electron tube via a plurality of symmetrical conductors of large areas with the elements of the oscillating circuit which control the frequency.

This form of electrical connection is favourable taking into account the extremely low resistances of the reactive elements of the oscillating circuit which control the frequency and which are present because of the requirement for higher reactive power.

Preferably the internal conductor and also the external conductor are respectively constructed of individual sheet parts which are mechanically fixedly connected together by welding soldering or riveting.

This particular construction of the internal and external conductors brings the advantage of a comparatively low constructional cost because the respective sheet parts can be accurately manufactured with simple tools to the desired dimensions and a plurality of similar constructional parts can be used for the construction of the oscillating circuit.

It is also of considerable significance that a high degree of mechanical stability is obtained by the vertical arrangement of the sheet parts of electrodes of the capacitor which permits the use of sheet metal parts of relatively small thickness without disadvantageously influencing the electrical stability of the circuit so that a saving of weight and material is achieved.

In accordance with a specially advantageous form of the invention the individual sheet metal parts are provided with lips at right angles at their edges and connected at the lips by end face seams.

The provision of lips for the sheet metal parts brings about a desired increase in the mechanical stability and simplifies the mutual connection through welding, soldering or riveting whereby lower electrical contact resistances are achievable by this kind of construction in contrast with the customary clamped connection.

The lips are so chosen in accordance with a further significant form of the invention that each of the four sheet metal parts has only one lip for the vertical connection seam and is connected at this lip with the non lipped edge of the following sheet metal part. In this manner the required cross-sectional geometry can be achieved through simple assembly devices in both cross-sectional axes and above all this system can be welded without distortion. The use of seams at the end faces means additional filler material can be dispensed with during welding.

Lastly it should also be mentioned that on account of the construction of the internal and external conductors from individual sheet metal parts and despite the unavoidable tolerances of these individual metal parts the necessary cross-sectional dimensions of the internal and external conductors can be extremely accurately maintained through the use of simple assembly devices, and especially through the use of guide jigs.

Figure 2:
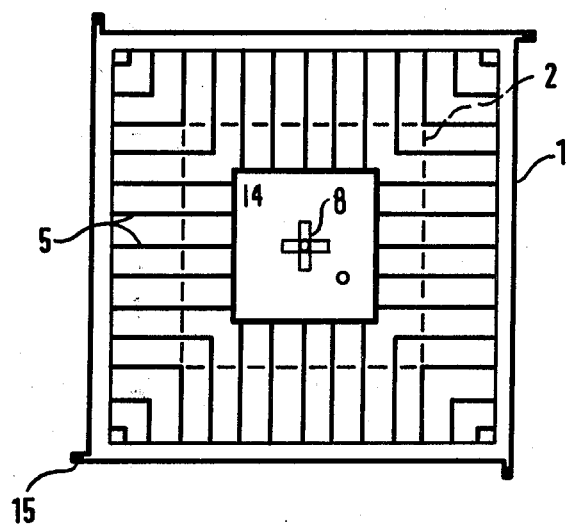

The invention will now be described by way of example only and with reference to the accompanying drawings which show:

FIG. 1 a schematic illustration of the principles of an oscillating circuit device for a high frequency industrial generator in accordance with the invention and FIG. 2 a schematic cross-sectional view of the electrode of the capacitor connected with the internal conductor of the coaxial conduction system on the line II–II of FIG. 1.

Turning now to FIGS. 1 and 2 an oscillating circuit device for a high frequency industrial generator comprises a coaxial conduction system of square cross section having an external conducting member 1 and an internal conducting member 2 with a decoupling space 3 defined between the internal conducting member and the external conducting member.

The entire capacity of the device is formed by vertically disposed plates 4 and 5 of a capacitor which also run at right angles to the surfaces of the internally and externally conducting members 2 and 1, and in which the plates 5 are electrically connected to the internal conducting member 2 and fixedly attached thereto whilst the plates 4 of the capacitor are electrically connected with the external conducting member 1 and are axially displacable relative thereto and can be locked in position relative to the fixed plates 5 of the capacitor so that the resonant frequency of the oscillator circuit can be adjusted without problem by changing the vertical position of the plates 4 of the capacitor.

Since the capacitor plates 4, 5 are arranged perpendicular to the external conducting member 1 they define rectilinear grids of upper and lower plates. FIG. 2 illustrates the rectilinear grid formed by the lower capacitor plates 5. The upper capacitor plates 4 interleaf with the lower plates 5 and they form a corresponding rectilinear grid of upper plates.

The construction, which is closed by a screening cover 6, contains a centrally arranged triode electron tube 9, the electrodes of which are preferably connected by symmetrical multiple connections of large area 8 with the reactive elements which determine the frequency of the oscillator circuit.

In FIG. 1 the connection for the heater and for the grid potential is schematically shown by the reference numeral 10 and the location for the supply of cooling water and anode potential is shown by the reference numeral 11. A snap closure valve 12 for the water is schematically illustrated.

A space 13 lies radially inwardly of the internal conducting member 2 and beneath the plates 4 and 5 of the capacitor and is maintained completely field free by the base member 7 of the fixed electrode 5, and can be used for housing the DC supply for the anode and the insulated supply tube or hose for the cooling water. By this means the supply is completely decoupled from high frequency components.

FIG. 2 shows the prefered construction of the coaxial conduction system using sheet metal parts provided with lips and the position and arrangement of the vertically disposed fixed electrode plates 5 of the capacitor.

The space 14 inside the plates of the capacitor is of square cross section and serves to receive triode electron tube 9 as is to be seen from FIG. 2.

The prefered form of the connection of the sheet metal parts, whose edges are provided with lips and which are used in the construction of the coaxial conduction system, is indicated at 15 where a weld in the form of a seam along an end face is illustrated.

The use of the previously described construction does not cause any difficulties in operating at powers of 60 kW or more so that operation at a stable frequency and the avoidance of the danger of the formation of parasitic resonances can be guaranteed and a high operational reliability is present.

While the means for adjusting the vertical position of the electrode 4 of the capacitor and for securing it in position have not been shown it will be appreciated by those skilled in the art that this needs to be done only once to tune the resonant frequency of the circuit to the desired value. The means for securing the electrode 4 in position can simply comprise a series of spot welds or clamp screws joining plates 4 to the external conductor 1 at the double lined position of the drawing as indicated at 16.

Adjustment of the vertical position of the electrode 5 can be simply effected by lifting means attached through the cover 6 and operable from outside. In its simplest form said lifting means could simply comprise two headed screw threaded members passing through the cover into respective screw threaded fittings on the electrode 5. The heads of the screw threaded members bearing on the top of the cover and being freely rotatable with respect thereto.

We claim:

1. An oscillating circuit arrangement for high frequency industrial generators suitable for warming an electrically poorly conducting substance and comprising a resonant circuit in the form of a coaxial conduction system including a capacitor having interdigitated plates and an associated electron tube and in which the coaxial conducting system is of square cross section and the plates of the capacitor are arranged at right angles to respective surfaces of internal and external conductors of the coaxial conduction system.

2. Oscillating circuit arrangement in accordance with claim 1 and in which the electron tube is disposed substantially on the central axis of the coaxial conduction system and is situated, at least partially, in a rectangular space surrounded by the plates for the capacitor.

3. Oscillating circuit arrangement in accordance with claim 2 and in which DC energy and cooling water supplies for the anode are contained within a field free space within the internal conductor.

4. Oscillating circuit arrangement in accordance with claim 1 and in which one of the electrodes of the capacitor is formed from vertically disposed plates and is fixedly positioned relative to and electrically connected with the internal conductor and that the other electrode of the capacitor is electrically connected with the external conductor and is axially displacable and securable relative thereto.

5. Oscillating circuit arrangement in accordance with claim 1 and in which the electron tube is arranged on the axis of the coaxial conduction system and that the connections with the elements which determine the frequency of the oscillating circuit are made via a plurality of symmetrical conductors of large area.

6. Oscillating circuit arrangement according to claim 1 and in which both the internal conductor and the external conductor are each formed from individual sheet metal parts there being provided means for mechanically fixedly connecting the individual sheet metal parts together to form the internal conductor and the external conductor respectively.

7. Oscillating circuit arrangement according to claim 6 in which said means comprises welding.

8. Oscillating circuit arrangement according to claim 6 in which said means comprises soldering.

9. Oscillating circuit arrangement according to claim 6 in which said means comprises riveting.

10. Oscillating circuit arrangement according to claim 6 and in which the individual sheet metal parts are each provided with at least one respective lip at a respective edge thereof and neighbouring sheet metal parts are connected together by means of a joint interconnecting one lip with an adjacent edge of the neighbouring part.

11. Oscillating circuit arrangement in accordance with claim 10 and in which each of the internal and external conductors respectively comprises four individual sheet metal parts.

* * * * *